United States Patent
Hsu et al.

(10) Patent No.: US 9,431,993 B1
(45) Date of Patent: Aug. 30, 2016

(54) TEMPERATURE COMPENSATED RESONATOR WITH A PAIR OF SPACED APART INTERNAL DIELECTRIC LAYERS

(75) Inventors: Wan-Thai Hsu, Saline, MI (US); John Ryan Clark, Howell, MI (US)

(73) Assignee: MICREL, INCORPORATED, San Jose, CA (US)

(*) Notice: Subject to any disclaimer, the term of this patent is extended or adjusted under 35 U.S.C. 154(b) by 1037 days.

(21) Appl. No.: 13/287,068

(22) Filed: Nov. 1, 2011

Related U.S. Application Data

(60) Provisional application No. 61/539,443, filed on Sep. 26, 2011.

(51) Int. Cl.
*H03H 9/24* (2006.01)
*H03H 9/02* (2006.01)

(52) U.S. Cl.
CPC ..... *H03H 9/02448* (2013.01); *H03H 9/02244* (2013.01); *H03H 9/02259* (2013.01); *H03H 9/02338* (2013.01); *H03H 2009/02291* (2013.01); *H03H 2009/02322* (2013.01); *H03H 2009/02503* (2013.01)

(58) Field of Classification Search
CPC .......... H03H 9/02102; H03H 9/02244; H03H 9/02433; H03H 9/02448; H03H 9/02503; H03H 2009/0233; H03H 9/02259; H03H 9/02338; H03H 2009/02291; H03H 2009/02322; H03H 2009/02488; H03H 2009/02503
USPC ........ 333/186, 187, 197, 199, 200; 310/346; 257/415–418
See application file for complete search history.

(56) References Cited

U.S. PATENT DOCUMENTS

| | | | |
|---|---|---|---|
| 6,249,073 B1 | 6/2001 | Nguyen et al. | |
| 6,557,419 B1 * | 5/2003 | Herb et al. | 73/766 |
| 6,930,569 B2 | 8/2005 | Hsu | |
| 7,449,968 B1 | 11/2008 | Cioffi | |
| 7,847,649 B2 * | 12/2010 | Van Beek et al. | 331/154 |
| 8,040,207 B2 | 10/2011 | Winkler et al. | |
| 8,878,633 B1 * | 11/2014 | Hsu et al. | 333/186 |
| 2002/0069701 A1 | 6/2002 | Hsu et al. | |
| 2005/0195050 A1 | 9/2005 | Lutz et al. | |
| 2007/0188269 A1 * | 8/2007 | Lutz et al. | 333/186 |
| 2007/0277620 A1 * | 12/2007 | Melamud et al. | 73/766 |
| 2009/0160581 A1 * | 6/2009 | Hagelin et al. | 333/200 |
| 2010/0019869 A1 * | 1/2010 | Durand et al. | 333/219.1 |
| 2010/0032789 A1 * | 2/2010 | Schoen et al. | 257/467 |
| 2011/0084781 A1 * | 4/2011 | Quevy et al. | 333/200 |
| 2013/0106246 A1 * | 5/2013 | Raieszadeh et al. | 310/346 |

OTHER PUBLICATIONS

Hsu et al., "Mechanically Temperature-Compensated Flexural-Mode Micromechanical Resonators", Technical Digest, IEEE International Electron Device Meeting (IEDM), San Francisco, California, pp. 399-402, Dec. 10-13, 2000.

(Continued)

*Primary Examiner* — Barbara Summons
(74) *Attorney, Agent, or Firm* — Lempia Summerfield Katz LLC

(57) ABSTRACT

A device includes a substrate, an electrode supported by the substrate, an anchor supported by the substrate, and a composite structure supported by the anchor, disposed adjacent the electrode, and configured for resonant vibration. The composite structure includes an external layer and an internal dielectric region covered by the external layer.

25 Claims, 10 Drawing Sheets

(56) References Cited

OTHER PUBLICATIONS

Hsu et al., "Stiffness-Compensated Temperature-Insensitive Micromechanical Resonators", to be published in Technical Digest, IEEE MEMS Conference, Las Vegas, pp. 731-734, Jan. 21-25, 2002.

Melamud et al., "Composite Flexural-Mode Resonator With Controllable Turnover Temperature," 20th IEEE International Workshop on Micro Electro Mechanical Systems (MEMS'07), Kobe, Japan, pp. 199-202 (2007).

Bahl et al., "Model and Observations of Dielectric Charge in Thermally Oxidized Silicon Resonators," Journal of Microelectromechanical Systems, vol. 19, No. 1, pp. 162-174, Feb. 2010.

Bahl et al., "Charge-Drift Elimination in Resonant Electrostatic MEMS," IEEE 23rd International Conference on Micro Electro Mechanical Systems, pp. 108-111 (2010).

Bahl, et al., "Observation of Fixed and Mobile Charge in Composite MEMS Resonator," Solid-State Sensors, Actuators, and Microsystems Workshop, pp. 102-105, 2008.

* cited by examiner

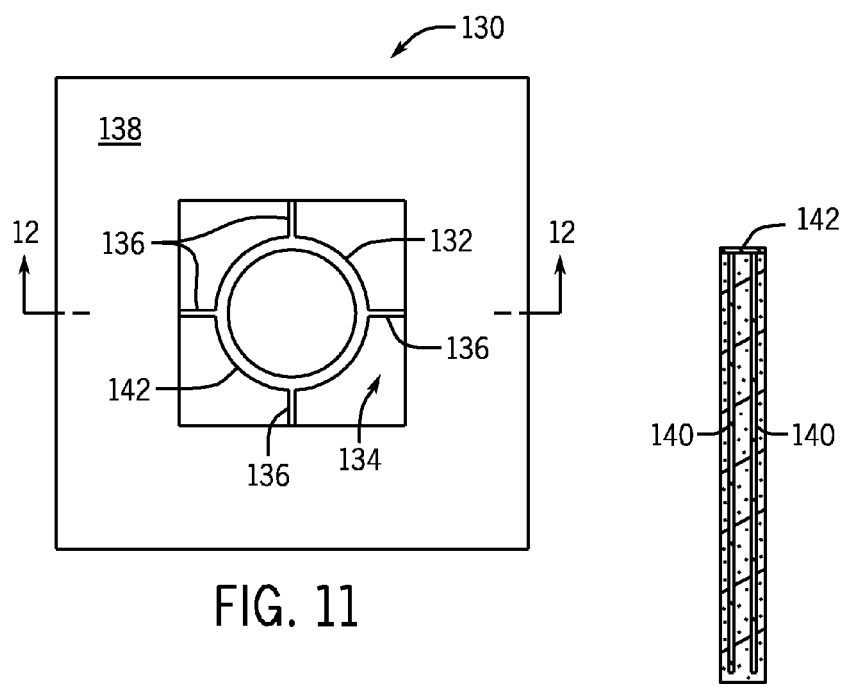
FIG. 11
FIG. 13
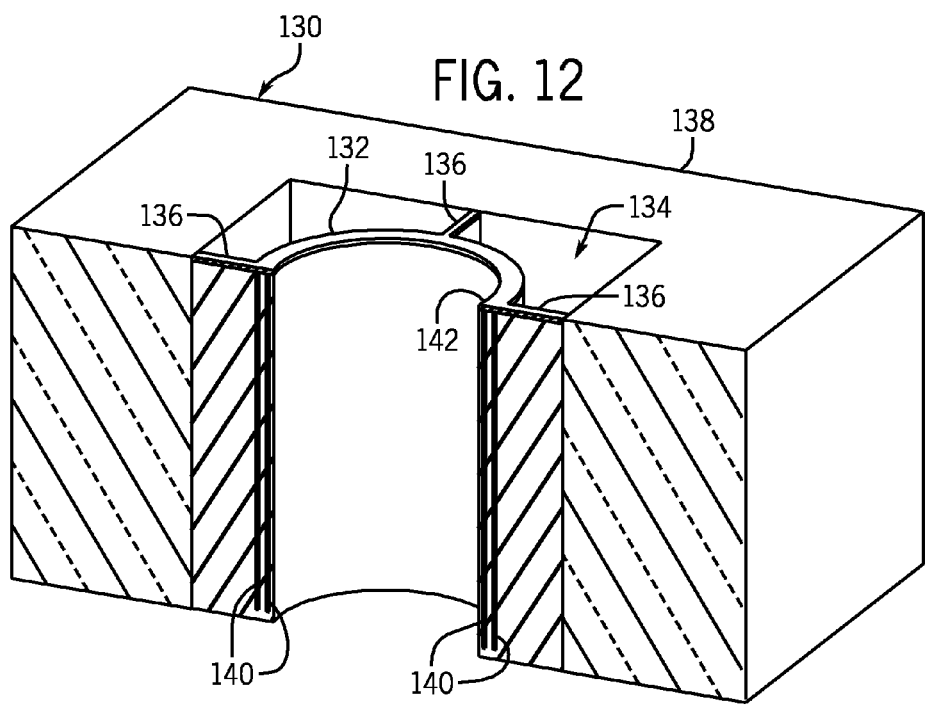
FIG. 12

TEMPERATURE COMPENSATED RESONATOR WITH A PAIR OF SPACED APART INTERNAL DIELECTRIC LAYERS

CROSS-REFERENCE TO RELATED APPLICATION

This application claims the benefit of U.S. provisional application entitled "Temperature Compensated Resonators with Dielectric Core," filed Sep. 26, 2011, and assigned Ser. No. 61/539,443, the entire disclosure of which is hereby expressly incorporated by reference.

BACKGROUND OF THE DISCLOSURE

1. Field of the Disclosure

The disclosure relates generally to micromechanical devices or micro-electromechanical systems (MEMS) and, more particularly, to micromechanical or MEMS resonators.

2. Brief Description of Related Technology

Surface micromachining is one of the mainstream fabrication processes for MEMS resonators. Surface micromachining produces devices capable of low voltage operation (e.g., due to small, well controlled gaps), with a smaller resonator size (e.g., typically 20-50 times smaller than other MEMS resonators) and at a lower manufacturing cost (e.g., an expensive silicon-on-insulator (SOI) substrate may be avoided). The devices are also compatible with various types of wafer level packaging processes, such as glass frit, eutectic bonding, and silicon-fusion bonding.

However, the simplicity of surface micromachining leads to MEMS resonators that are more difficult to mechanically compensate for temperature-based shifts of the resonant frequency of the resonator device. The resonant frequency of a typical surface micromachined resonator has a temperature coefficient of frequency of about −20 ppm/° C. over an operating temperature range from, for instance, about −40° C. to about 85° C. Attempts at mechanical temperature compensation to address such temperature-based frequency instability have been described in Hsu, et al., "Mechanically Temperature-Compensated Flexural-Mode Micromechanical Resonators," Technical Digest, IEEE International Electron Device Meeting (IEDM), pp. 399-402 (2000), and Hsu et al., "Stiffness-compensated temperature-insensitive micromechanical resonators", Technical Digest, IEEE MEMS Conference, pp. 731-734 (2002), the entire disclosures of which are hereby incorporated by reference.

SUMMARY OF THE DISCLOSURE

In accordance with one aspect of the disclosure, a device includes a substrate, an electrode supported by the substrate, an anchor supported by the substrate, and a composite structure supported by the anchor, disposed adjacent the electrode, and configured for resonant vibration. The composite structure includes an external layer and an internal dielectric region covered by the external layer.

In some cases, the external layer is one of a plurality of layers of the composite structure. The internal dielectric region may then be enclosed by the plurality of layers.

The external layer may include a conductive material, such as polysilicon. Alternatively or additionally, the composite structure includes single crystal silicon within which the internal dielectric region is disposed. Alternatively or additionally, the internal dielectric region includes silicon dioxide.

In some embodiments, the internal dielectric region is configured as an internal core of the flexible structure. Alternatively or additionally, the external layer includes a polysilicon shell. The internal dielectric region may then include a silicon dioxide core disposed within the polysilicon shell.

The composite structure may be beam-shaped.

In some cases, the electrode and the composite structure are spaced apart from one another by a gap. The resonant vibration may then be within the gap.

In some embodiments, the internal dielectric region is one of a plurality of dielectric regions spaced from one another and covered by the external layer.

The internal dielectric region may be not centered within the composite structure. Alternatively or additionally, the internal dielectric region is offset from a center of the composite structure toward an external surface of the composite structure distal from the substrate.

The composite structure may be configured for flexural mode vibration. Alternatively or additionally, the composite structure is configured for wine-glass mode vibration.

In accordance with another aspect of the disclosure, a micromechanical device includes a substrate, an electrode supported by the substrate, an anchor supported by the substrate, and a composite structure supported by the anchor, disposed adjacent the electrode, and configured for resonant vibration. The composite structure includes an external polysilicon region and an internal region having a positive temperature coefficient of Young's modulus.

The internal region may be embedded in the polysilicon region. Alternatively or additionally, the internal region includes silicon dioxide. Alternatively or additionally, the internal region is configured as an internal core of the composite structure. Alternatively or additionally, the composite structure is beam-shaped. Alternatively or additionally, the electrode and the composite structure are spaced apart from one another by a gap. The resonant vibration may then be within the gap.

In some cases, the internal region is one of a plurality of internal regions spaced from one another within the external polysilicon region. Each internal region of the plurality of internal regions may have a positive temperature coefficient of Young's modulus.

In some embodiments, the internal dielectric region is not centered within the composite structure.

In accordance with yet another aspect, a method is useful for fabricating a micromechanical device on a substrate, which supports a first device layer. The method includes forming a dielectric structure in a device area, the dielectric structure being supported by the first device layer, depositing a second device layer across the device area, and patterning the first and second device layers to form a composite structure and an electrode in the device area. The composite structure includes the dielectric structure covered by the patterned first and second device layers. The method further includes releasing the composite structure such that the composite structure is configured for resonant vibration relative to the substrate.

In some cases, the method further includes depositing a sacrificial layer across the device area, patterning the sacrificial layer deposited across the device area, and depositing the first device layer across the device area. Releasing the composite structure may then include removing the sacrificial layer to form a gap between the composite structure and the electrode.

The first and second device layers may include polysilicon and the dielectric structure may include silicon dioxide.

Alternatively or additionally, a portion of the first device layer is configured as an anchor coupling the composite structure and the substrate.

In some embodiments, the method further includes forming a second dielectric structure supported by the second device layer, and depositing a third device layer across the device area such that the flexible composite structure includes the second dielectric structure covered by the third device layer.

Forming the dielectric structure may include implanting oxygen in the first device layer, and annealing the first device layer to form an oxide.

In some embodiments, the first device layer includes a single crystal silicon layer disposed on an insulator layer in a silicon-on-insulator (SOI) arrangement supported by the substrate. Releasing the composite structure may include removing a portion of the insulator layer. Forming the dielectric structure may include etching the single crystal silicon layer to form a trench in the single crystal layer, and filling the trench with a dielectric material. Filling the trench may include thermally growing a silicon dioxide layer. Alternatively or additionally, the method further includes removing the silicon dioxide layer disposed outside of the trench.

Depositing the second device layer may include depositing a polysilicon layer configured as a cap to cover the trench.

BRIEF DESCRIPTION OF THE DRAWING FIGURES

For a more complete understanding of the disclosure, reference should be made to the following detailed description and accompanying drawing figures, in which like reference numerals identify like elements in the figures.

FIG. 11 is a top, schematic view of an exemplary lateral flexural mode MEMS resonator device constructed in accordance with a silicon-on-insulator (SOI) embodiment.

FIG. 12 is a cross-sectional, schematic view of the lateral flexural mode MEMS resonator device of FIG. 11 taken along lines 12-12 of FIG. 11.

FIG. 13 is a detailed, partial, cross-sectional view of a resonant structure of the lateral flexural mode MEMS resonator device of FIG. 11 having a multiple dielectric layer core constructed in accordance with one embodiment.

Figure 1:
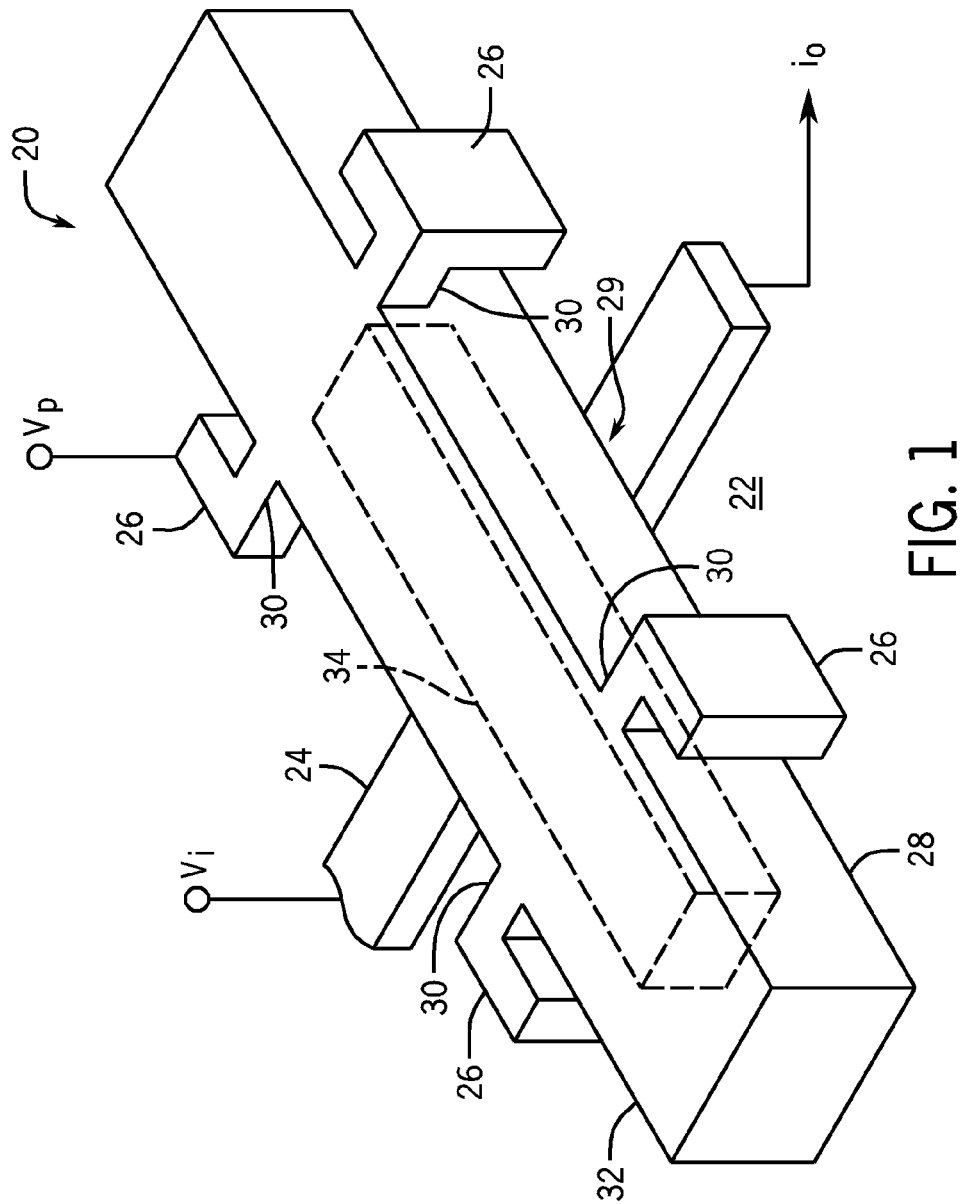
FIG. 1 is a perspective, schematic view of an exemplary MEMS resonator device constructed in accordance with one or more aspects of the disclosure.

While the disclosed processes and devices are susceptible of embodiments in various forms, there are illustrated in the drawing (and will hereafter be described) specific embodiments of the invention, with the understanding that the disclosure is intended to be illustrative, and is not intended to limit the invention to the specific embodiments described and illustrated herein.

DETAILED DESCRIPTION OF THE DISCLOSURE

The disclosure relates to MEMS resonator devices and methods of fabricating MEMS resonator devices having an internal core configured to reduce temperature instability of the resonant frequency of the device. The internal cores lower the frequency deviation of the disclosed MEMS resonator devices by effectively counteracting the thermal dependence of the Young's modulus arising from one or more materials or structures in the devices with an opposing thermal dependence. The internal cores may have a sufficiently positive temperature coefficient of Young's modulus to counteract or effectively cancel a negative temperature coefficient of Young's modulus presented by other material(s) in the resonator device. The result may be an effective zero or otherwise reduced temperature coefficient of Young's modulus. Such improvements in temperature stability may be achieved despite the temperature dependence of materials typically used in surface micromachining and other MEMS resonator fabrication processes. For example, the temperature coefficient of Young's modulus for polysilicon-based resonant structures may otherwise result in approximately −20 ppm per Celsius degree of deviation in resonant frequency.

The disclosed MEMS resonator devices may include one or more internal temperature compensation layers or other regions. The number, positioning, shape, size (e.g., thickness), and other parameters of the layers or regions may be selected to control or customize the temperature compensation effect.

In one aspect, the disclosure is directed to a fabrication process for controlling and/or customizing a temperature compensation structure having, for instance, one or more layers, within a resonant structure. The fabrication process may incorporate the temperature compensation structure within a polysilicon resonant structure constructed via a surface micromachining fabrication process, or a single crystal silicon resonant structure constructed via a silicon-on-insulator (SOI)-based micromachining fabrication process. Other embodiments of the disclosed fabrication processes may involve other types of micromachining processes or techniques.

The temperature stability of the disclosed devices may lead to use in a wide variety of applications, devices, and systems. For instance, the disclosed MEMS resonator devices may be used in various wireless technology applications, devices, and systems, including oscillators and other timing devices.

Although described in connection with electrostatically transduced resonator devices, one or more aspects of the disclosure may be applied to other transducer arrangements. For example, one or more aspects of the disclosed devices may be applied to resonant structures having a piezoelectric material for piezoelectric transduction. The electrode(s) is not spaced from the piezoelectric resonant structure in such cases, but rather abutting a surface thereof. The temperature performance of such devices may nonetheless benefit from a composite arrangement in the resonant structure, as described herein.

Other aspects of the resonant structures may also vary from the examples described herein, including shape and resonant mode. The disclosure is not limited to any particular shape or resonant mode. Although described below in connection with beam-shaped and ring- or cylinder-shaped resonant structures, other shapes (e.g., disc) may benefit from temperature compensating characteristics of the composite resonant structures described herein. One or more aspects of the disclosed devices may be applied to a variety of different resonant modes and other resonance configurations. For example, the disclosed devices may be configured for resonant vibration involving bulk acoustic vibration (e.g., wine-glass mode or other expansion mode) as opposed to flexural movement, which also may vary between different orientations and types (e.g., lateral, vertical, wine-glass mode, etc.). The disclosure is also not limited to any particular type of fabrication process, despite the description of exemplary processes involving surface micromachining and SOI-based fabrication techniques.

FIG. 1 shows an exemplary MEMS resonator device 20 constructed in accordance with one embodiment. The device 20 includes a substrate 22 on which an electrode 24 and anchors 26 are disposed. The anchors 26, in turn, support a resonant structure 28 in a cantilevered, suspended, or other spaced position relative to the substrate 22 and the electrode 24. The electrode 24 is disposed adjacent the resonant structure 28 such that the device 20 is configured as an electrostatically transduced resonator device. The resonant structure 28 is configured for resonant vibration in a gap 29 between the electrode 24 and the resonant structure 28. To that end, the resonant structure 28 may include one or more conductive materials, surfaces, and/or regions for electrostatic excitation. In this example, an AC input or drive signal $v_i$ is applied to the electrode 24 to excite the resonant structure 28 into vibration. The resonant structure 28 may be biased at a DC voltage $V_p$ relative to the electrode 24. The bias voltage $V_p$ may be used to pull down or otherwise draw the resonant structure 28 toward the electrode 24 to promote vibration, increase stiffness, resonant frequency, etc. The excitation of the resonant structure 28 results in vibration at a fundamental (or other) resonant frequency of the resonant structure 28. The output of the device 20 is sensed by the electrode 24 in this example as a sense current $i_o$. The resonant structure 28 may be coupled to the anchors 24 via respective support arms 30, which may be attached to the resonant structure 28 at nodal points of the fundamental or other desired resonant mode achieved during operation. The example of FIG. 1 is thus configured with free rather than fixed ends, a so-called free-free resonator arrangement that minimizes losses to the substrate 22, but other embodiments may include one or more clamped or otherwise fixed ends.

In this example, the resonant structure 28 is beam-shaped for a flexural mode of vibration. The vibration mode primarily includes movement in a direction vertical or transverse to the plane of the substrate 22. The electrode and the composite structure may thus be oriented relative to one another for vibration of the composite structure transverse to the substrate 22. In other examples, the flexural mode of vibration includes movement in a direction lateral or parallel to the plane of the substrate 22. As described below, the vibration mode need not be flexural and instead may be based on movement involving, for instance, expansion and contraction of the resonant structure 28.

The above-described components of the device 20 may be formed via surface micromachining fabrication techniques, examples of which are described below. The electrode 24 and the anchors 26 may be made of polysilicon or other conductive materials. The polysilicon regions of the structures may be doped (e.g., n-type or p-type) to a dopant concentration sufficient to reach a desired conductivity level. The anchors 26 may be integrally formed with the resonant structure 28, which may thus include polysilicon as well.

The resonant structure 28 is configured as a composite structure supported by the anchors 26, spaced from the electrode 24 by the gap 29, and configured for resonant vibration within the gap 29. The composite structure includes an external layer or region 32 and an internal dielectric region 34 covered by the external layer 32. The external layer 32 may include a conductive material. In one example, the external layer 32 includes polysilicon and the internal dielectric region 34 includes silicon dioxide. In this way, the positive temperature coefficient of Young's modulus for silicon dioxide may be used to offset the negative temperature coefficient of polysilicon. The internal dielectric region 34 may include one or more additional or alternative materials with a positive temperature coefficient of Young's modulus. Such alternatives may include any now or later known materials with a positive temperature coefficient of Young's modulus, including any materials (or material combinations) engineered to exhibit a positive temperature coefficient of Young's modulus.

The internal dielectric region 34 may be configured as an internal core of the composite structure 28. In this example, the external layer 32 includes a polysilicon shell, which may enclose the internal core-shaped dielectric region 34. The composite structure may include one or more other layers or regions in which the internal dielectric region 34 is embedded, or by which the internal dielectric region 34 is covered. In one example, the internal dielectric region 34 may include a silicon dioxide core disposed within the polysilicon shell.

The device 20 may include any number of electrodes and anchors. The shape, size, positioning, and other characteristics of the electrodes and anchors may vary considerably from the example shown. For example, the device 20 need not configured as a single terminal device, and instead may be configured with separate sense and drive electrodes spaced from the resonant structure 28. The device 20 may also include any number of sense electrodes, and any number of drive electrodes. The structural support, bias, and excitation framework and arrangement of the device 20 may vary considerably from the example shown.

In some cases, the substrate 22 may include a silicon or other semiconductor base, or original substrate, along with various types of semiconductor, insulating, or other layers, such as epitaxial layers, formed thereon. The electrode 24, the anchors 26, and other components of the device 20 need not be disposed directly on the substrate 22, and instead may be supported indirectly by the substrate 22 via any number of such intervening layers.

Further details regarding the device 20, one or more of its constituent structures, and/or the fabrication of the device 20 and/or its constituent structures may be found in U.S. Pat. No. 6,249,073 ("Device including a micromechanical resonator having an operating frequency and method of extending same") and U.S. Pat. No. 6,930,569 ("Micromechanical resonator having short support arms"), the entire disclosures of which are incorporated by reference. The temperature compensation features of the device 20 may be combined with one or more other temperature compensation techniques (e.g., mechanical, electrical, oven-based, etc.), such as those described in U.S. Patent Publication No. 2002/0069701 ("Micromechanical resonator device") and U.S. Pat. No. 7,449,968 ("Frequency and temperature compensation synthesis for a MEMS resonator"), the entire disclosures of which are incorporated by reference.

The device 20 is shown in schematic form for convenience in illustration, and may include a number of other components in certain applications or operational configurations. For example, the thickness and other dimensions of the structures depicted in FIG. 1 may be exaggerated and out of scale for ease in illustration. The internal dielectric region 34 need not be shaped in a manner similar to the overall resonant structure 28. The internal dielectric region 34 may thus have a contour that differs from the resonant structure 28. As shown and described herein, the shape, size, and other characteristics of the resonant structure 28 and the internal dielectric region 34 thereof may vary considerably from the beam-shaped example of FIG. 1. The internal dielectric core or other region may be incorporated into a wide variety of resonant structures with any manner of structural complexity (e.g., trusses, shuttles, multiple beam construction, etc.).

Figure 2:
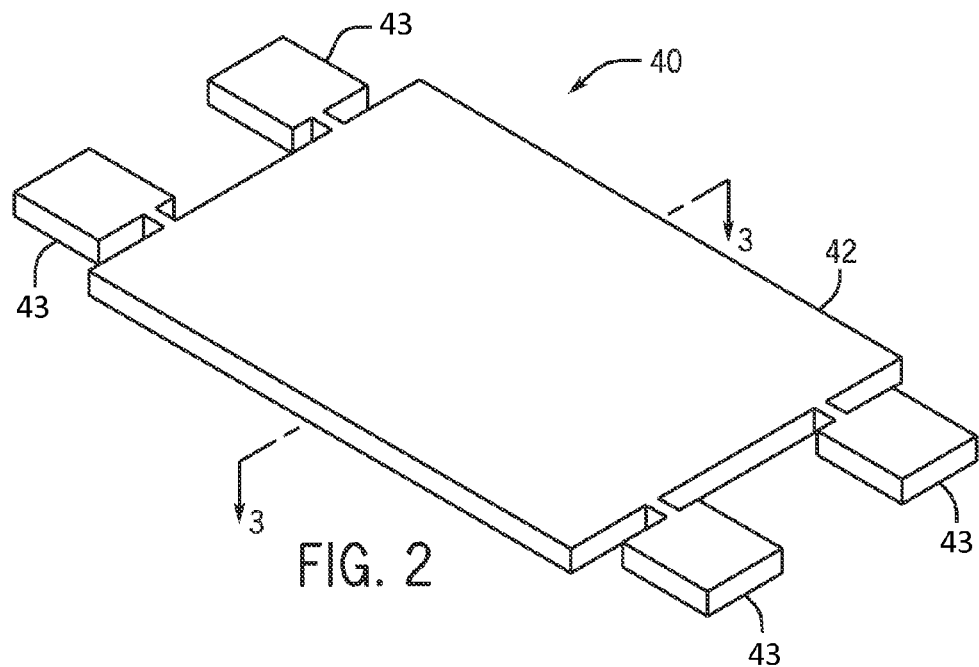
FIG. 2 is a perspective, schematic view of an exemplary MEMS resonant structure constructed in accordance with one or more aspects of the disclosure.

FIG. 2 shows another exemplary micro-machined polysilicon resonator device 40 configured in accordance with one or more aspects of the disclosure. The device 40 includes a composite resonant structure 42 supported by anchors 43 in a free-free resonator configuration in which the relative dimensions of the structures are modified considerably from the above-described example. Nonetheless, the composite resonant structure 42 may be similarly configured for vibration in a flexural mode with the anchors 43 positioned at nodal points. The composite resonant structure 42 may also be considered beam-shaped, despite both lateral dimensions of the structure 42 being greater than the thickness of the structure 42. The composite resonant structure 42 may include a polysilicon outer shell similar to the above-described example.

Figure 3A:
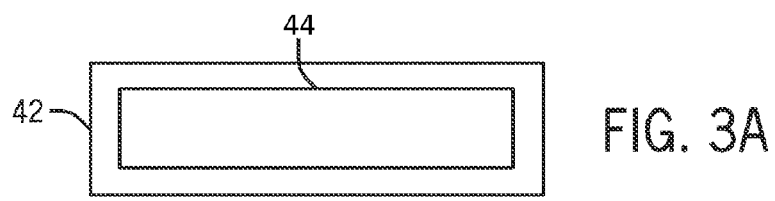
FIGS. 3A and 3B are cross-sectional, schematic views of the MEMS resonant structure taken along lines 3-3 of FIG. 2 in accordance with alternative embodiments.
Figure 3B:
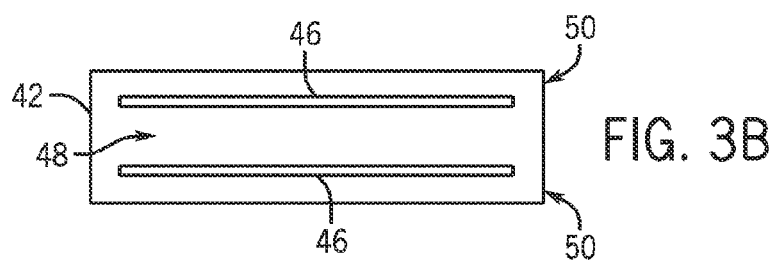

FIGS. 3A and 3B depict alternative cross-sections of the composite resonant structure 42. In the example of FIG. 3A, the composite resonant structure 42 includes a single core region 44 configured for temperature compensation as described herein. The core region 44 may include silicon dioxide or any other material with a positive temperature coefficient of Young's modulus. The core region 44 may be centered within the composite resonant structure 42. For example, the core region 44 may be disposed such that the composite resonant structure 42 and the core region 44 have a common center. The core region 44 may be configured to be symmetrically disposed within the composite resonant structure 42. Alternatively, the core region 44 may be offset from the center of the resonant structure 42 in one direction or dimension (e.g., the vertical direction transverse to the substrate). The core region 44 may remain centered within the resonant structure 42 in the other dimensions (e.g., the lateral directions). For example, the core region 44 may have opposed ends (or other lateral faces or sides) equidistant from corresponding ends (or other lateral faces or sides) of the composite resonant structure 42, but be disposed closer to the external surface forming an upper or top face of the resonant structure (i.e., the surface distal from the substrate) than to a lower or bottom face of the resonant structure (i.e., the surface proximate the substrate).

In the example of FIG. 3A, the core region 44 has a cross-section with a rectilinear contour that matches the contour of the composite resonant structure 42. The composite resonant structure 42 and the core region 44 may have matching shapes to provide design flexibility (e.g., support a wide range of core thicknesses).

The example of FIG. 3B, in contrast, has multiple internal regions 46 configured for temperature compensation. Each internal region 46 is embedded within the composite resonant structure 42 or otherwise covered, as described in the examples above. However, in this case, the internal regions 46 are spaced from one another within the interior of the structure 42. For example, the internal regions 46 may be separated by a polysilicon layer 48 disposed in a center position. The polysilicon layer 48 may be one of a plurality of polysilicon layers of the composite structure 42, with a pair of other layers 50 being disposed above and below the internal regions 46, thereby forming a sandwiched or stacked configuration having multiple embedded regions. Deposition or other formation of the plurality of polysilicon layers effectively encloses or embeds the internal region 46 within the composite structure 42. Once embedded, the internal regions 46 may be considered collectively, either with or without the polysilicon layer 48, as a single internal core.

The spacing of the internal regions 46 results in an offset positioning relative to the center of the composite structure 42. In this example, each internal region 46 is oriented in a respective plane parallel to upper and lower faces of the composite structure 42. The respective planes may be symmetrically disposed with respect to the center of the composite structure 42, such that each plane is embedded at the same depth relative to the corresponding external face of the composite structure. The internal regions 46 may remain centered relative to the lateral faces or sides of the composite structure 42. The lateral shape of each internal region 46 (as viewed, for instance, from above) may match the shape of the composite structure 42. However, the lateral shapes need not match, as described in several alternative embodiments below.

Figure 4A:
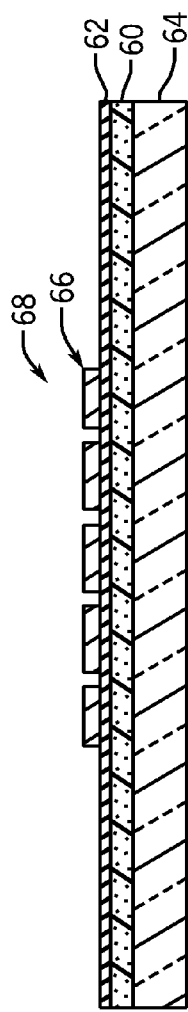
FIGS. 4A-4H are cross-sectional, schematic views of an exemplary MEMS resonator device during a surface micromachining process of fabricating the MEMS resonator device in accordance with one embodiment.
Figure 4B:
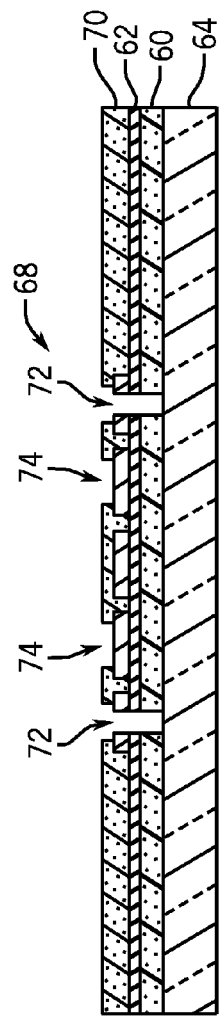

FIGS. 4A-4H show an exemplary surface micromachining process for fabricating the flexural mode resonator devices of FIGS. 1 and 2. In FIG. 4A, a silicon dioxide (or oxide) layer 60 and a silicon nitride layer 62 are deposited on or otherwise above a substrate 64. Polysilicon is then deposited on or otherwise above the oxide layer 60 and patterned to form an electrode layer 66 in a device area 68. FIG. 4B depicts the deposition of a sacrificial oxide layer 70 across the device area 68. The oxide layer 70 is deposited on or otherwise above the electrode layer 66 and other exposed layers in the device area 68. The sacrificial oxide layer 70 is then patterned to form one or more substrate anchor areas 72 and one or more resonator anchor areas 74, thereby exposing the substrate 64 and the patterned electrode layer 66, respectively.

Figure 4C:
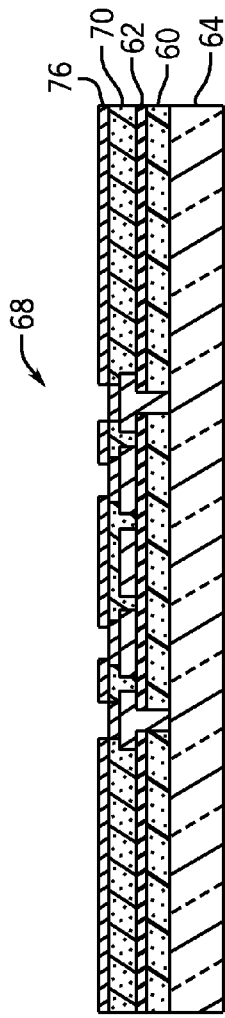
Figure 4D:
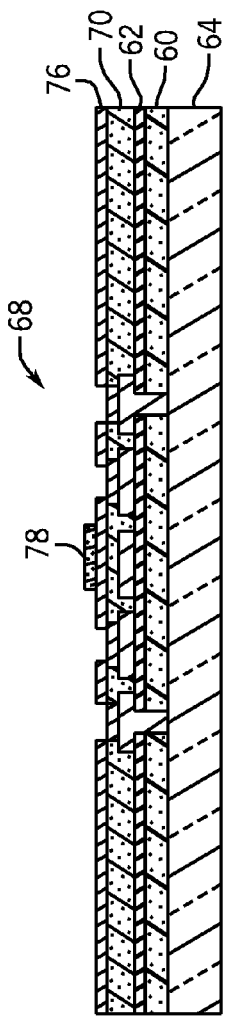

In FIG. 4C, a first device layer 76 is conformally deposited across the device area 68. The first device layer 76 may include polysilicon supported by the substrate 64 (and one or more intervening layers) for formation of a portion (e.g., half) of the resonant and other constituent structures of the resonator device in the device area 68. As shown in FIG. 4D, a dielectric structure 78 may then be formed in the device area 68. An oxide or other dielectric or positive temperature coefficient material layer may be deposited on or otherwise formed above (and supported by) the first device layer 76 to form the structure 78. The dielectric structure 78 may be patterned to form the above-described internal core region of the composite structure. The core region may thus have any desired thickness or lateral shape and size.

Figure 4E:
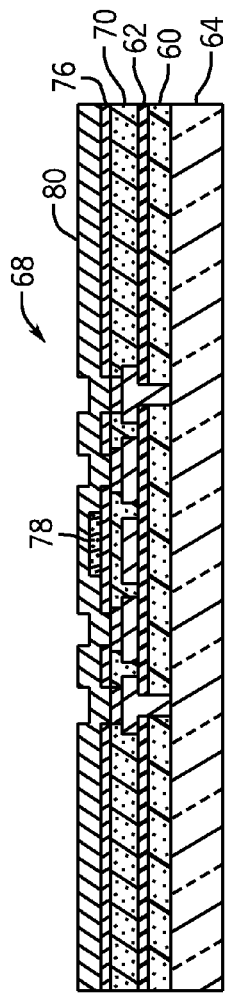

A second device layer 80 is deposited across the device area 68, as shown in FIG. 4E. The second device layer 80 may include the same material(s) as the first device layer 76 (e.g., polysilicon). The second device layer 80 may alternatively include one or more materials not incorporated into the first device layer 76, such as one or more non-conductive materials. Regardless of material type(s), the second device layer 80 covers the dielectric structure 78. Together, the first and second device layers 76 and 80 enclose the dielectric structure 78. Formation of only a portion of the resonant structure in FIG. 4C allows the dielectric structure 78 to be embedded by the first and second device layers 76, 80 in a composite resonant structure.

The second device layer 80 may finish or complete the deposition of conductive and other materials that form the resonant structure and other constituent structures of the resonator device. Alternatively, one or more further device layers may be deposited to, for instance, support the formation of a multiple structure dielectric core, in which two or more dielectric structures are spaced apart by a device layer. For example, a second dielectric structure may be formed in the device area 68 on or otherwise above the second device layer 80, and a third device layer may then be deposited across the device area 68 such that a composite structure is formed as shown, for instance, in FIG. 3B, with the second dielectric structure covered by the third device layer.

Figure 4F:
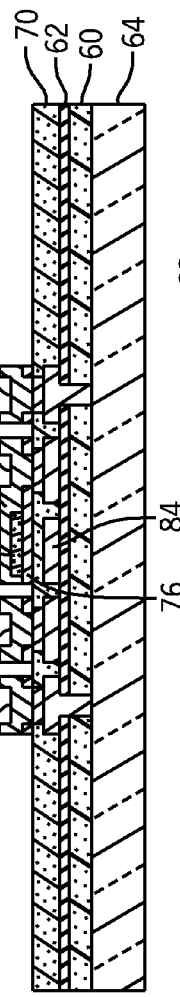

In FIG. 4F, the first and second device layers 76, 80 are patterned to form a composite structure 82, one or more electrodes 84, and one or more anchors 86 in the device area 68. One or more of the anchors 86 may couple the composite structure 82 to the substrate 64 as shown. However, these structures and other components of the device are shown in schematic form, and may vary considerably in practice. For example, the resonant structure 82 need not be configured as a cantilever beam as shown. Regardless of the external shape or form of the composite structure 82, the composite structure 82 includes the dielectric structure 78 covered by the patterned first and second device layers 76, 80. Embedding the dielectric structure 78 in that manner does not limit the disclosed devices to any particular type of resonant structure or resonant mode, but instead supports a wide variety of shapes, forms, and other configurations.

Figure 4G:
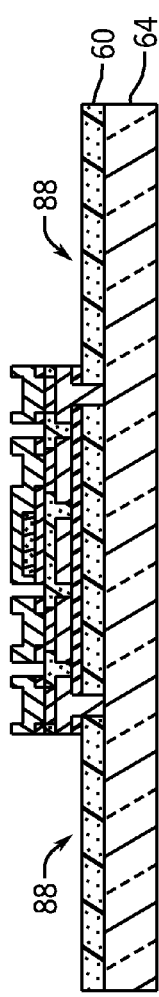
Figure 4H:
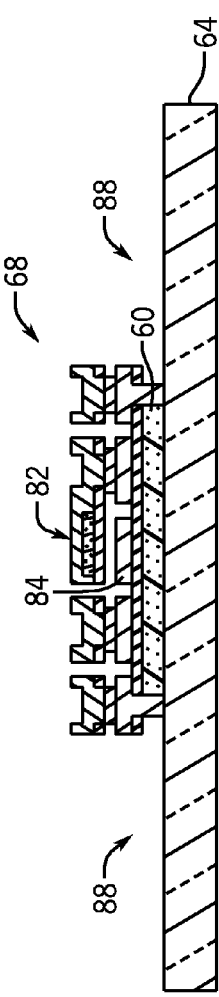

The sacrificial oxide layer 70 and the nitride layer 62 may be removed from one or more bond pad areas 88 via etching, as shown in FIG. 4G. The bond pad areas 88 may, for instance, be located outside of the device area 68. The oxide layer 60 may remain disposed on the substrate 64 in the bond pad areas 88, and the sacrificial oxide layer 70 may remain in the device area 68. These oxide layers 60, 70 may be removed as shown in FIG. 4H. Removal of the sacrificial oxide layer 70 from the device area 68 releases the composite structure 82 for resonant vibration relative to the substrate 64 and, in electrostatic embodiments, the electrode(s) 84. Releasing the composite structure 82 removes the sacrificial oxide layer 70 to form a gap between the composite structure 82 and the electrode(s) 84. A portion of the oxide layer 60 covered by the device structures may remain supported by the substrate 64 in the device area 70 for isolation, support, etc.

One or more of the above-described fabrication process acts may be modified from the example shown. For instance, the dielectric structure 78 may be formed by implanting oxygen (e.g., oxygen ions) in the first device layer 76. An annealing act may then form an embedded oxide layer in the first device layer 76. The second device layer 80 may nonetheless be deposited to ensure that the oxide is not exposed.

Figure 5:
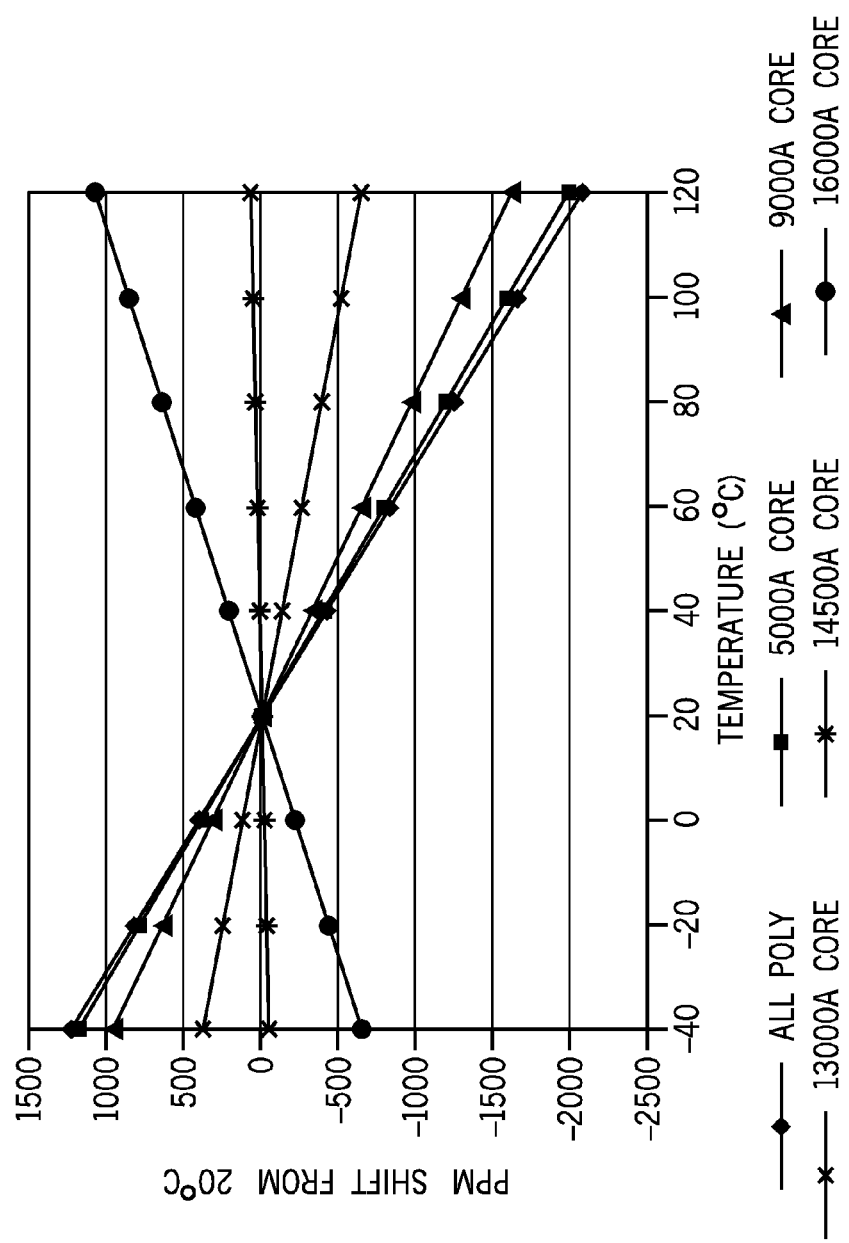
FIG. 5 is a graphical plot of temperature compensation performance of a number of MEMS resonator devices having a single dielectric layer (e.g., oxide) core in accordance with one embodiment shown in comparison with a MEMS resonator with an all-polysilicon resonator.

FIG. 5 is a graphical representation of the effects on temperature-based excursion of the resonant frequency (temperature coefficient of frequency, or TCf) of exemplary polysilicon resonators configured with a single layer compensation structure similar to the structure shown in FIG. 3A. Each resonator device has a free-free, short support configuration, as described in one of the above-referenced U.S. patents. Data from several resonators having internal oxide cores of varying thicknesses (e.g., 5000 A, 9000 A, etc.). Zero TCf may be achieved with around an embedded oxide layer having a thickness of about 1.45 µm.

Figure 6:
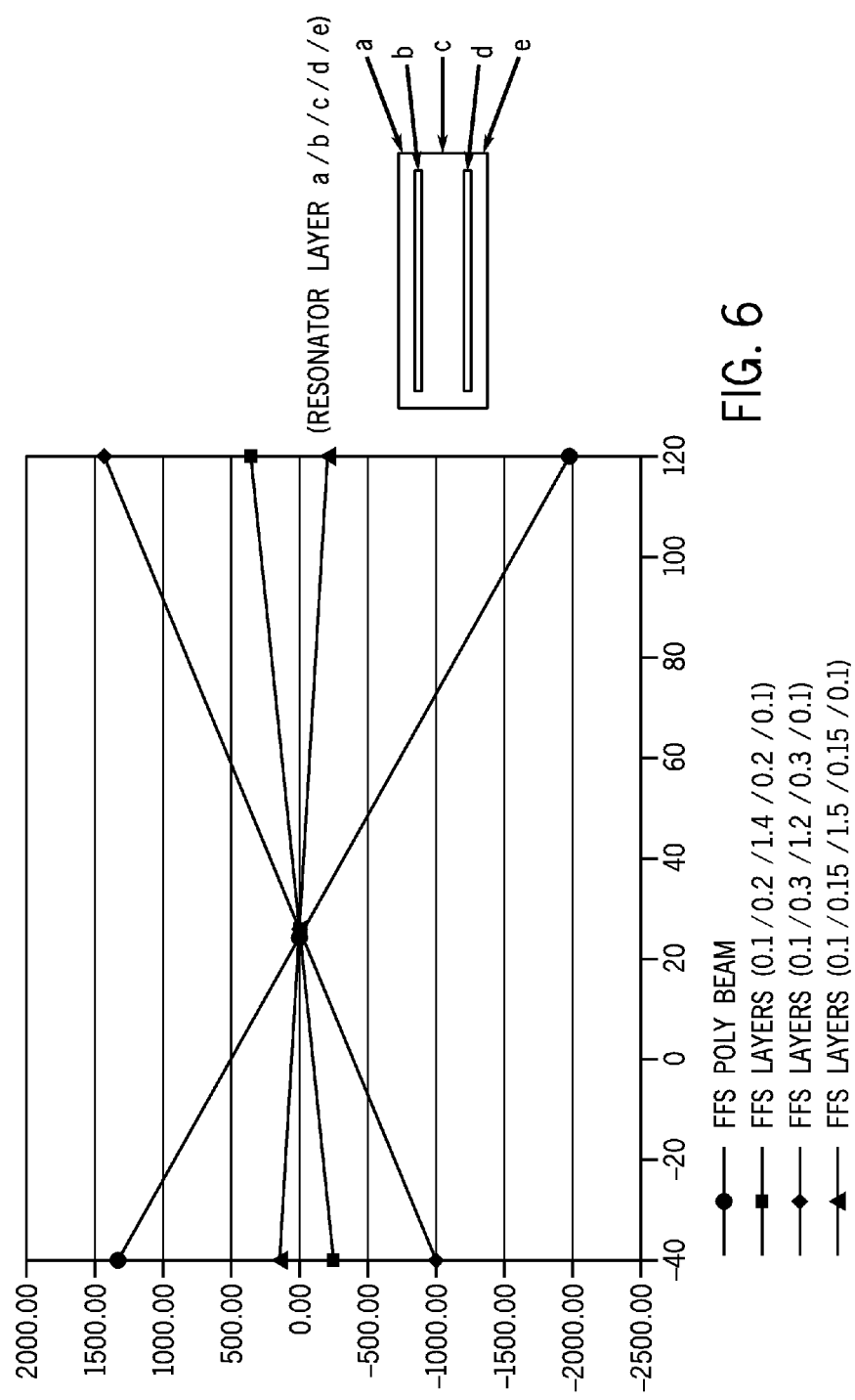
FIG. 6 is a graphical plot of temperature compensation performance of a number of MEMS resonator devices having a multiple dielectric layer (e.g., oxide) core in accordance with one embodiment shown in comparison with a MEMS resonator with an all-polysilicon resonator.

FIG. 6 is a graphical representation of the temperature compensation effects of a multiple layer core on free-free, short support resonator devices. The temperature compensated devices have two oxide layers, such as that shown in FIG. 3B. The thicknesses of the respective layers of the resonant structure are indicated in the legend, with the second and fourth listed thicknesses corresponding with the oxide layers. In each example, the oxide layers are biased outward toward the external surfaces, such that the outer polysilicon layers are only 0.1 µm thick. In contrast, the spacing between the oxide layers in each case is over 1 µm (e.g., 1.2-1.5 µm). The TCf data is shown in comparison with that of a simple polysilicon beam without any internal dielectric or other positive temperature coefficient core. The TCf performance is effective with the pair of oxide layers offset from center, despite using less overall oxide in the resonant structure.

Figure 7:
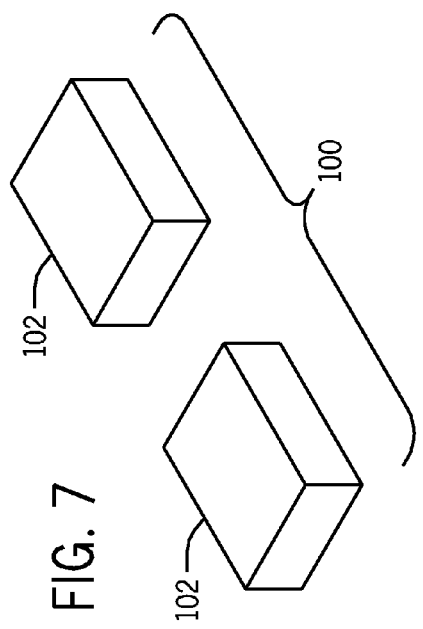

FIGS. 7-10 are directed to alternative internal core configurations. The depicted configurations may be incorporated into single or multiple structure core arrangements. The internal cores of the disclosed devices are not limited to square or other rectilinear layouts or shapes. Moreover, the area in which the internal structures are disposed need not be contiguous or of uniform thickness. The shape and configuration of the internal cores may vary considerably from the examples described above. FIG. 7 shows an exemplary core 100 having a pair of spaced apart sections 102 disposed at a common height or layer. Each section 102 may have any desired shape. The sections 102 may be symmetrically disposed about the center of the resonant structure or, in multiple layer configurations, symmetrically disposed in the lateral dimensions of the resonant structure. The spaced apart nature of the sections 102 may allow the device designer to dispose the core in areas, for instance, of least or greatest movement (e.g., near or spaced from the nodal points, respectively).

Figure 9:
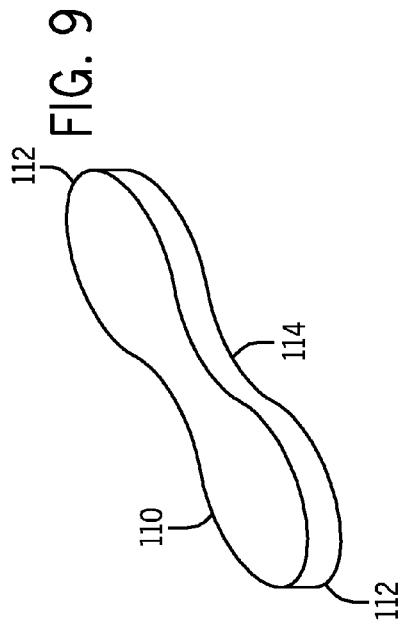
FIGS. 7-10 are perspective, schematic views of exemplary dielectric cores for a MEMS resonator device in accordance with several embodiments.
Figure 10:
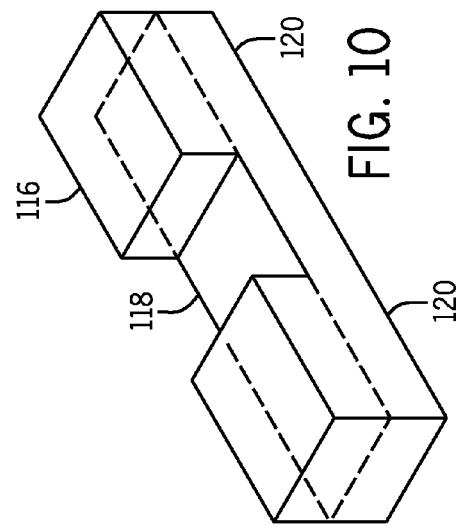
Figure 8:
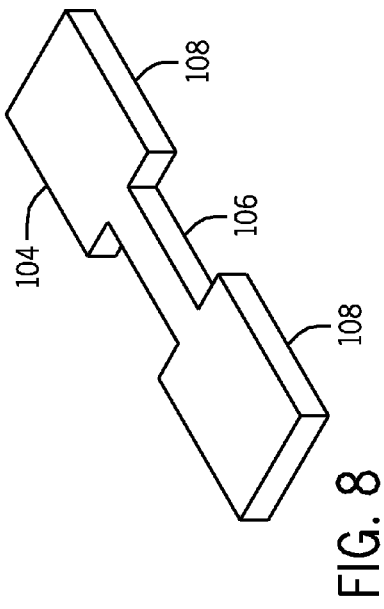

FIG. 8 shows another alternative core 104 having a non-uniform lateral dimension. In this example, the core 104 includes a central neck 106 coupling a pair of spaced apart pads 108. Alternatively, the narrowed portion of the core may be disposed outward of a centrally disposed pad or other wider portion. FIG. 9 is another exemplary core 110 with a non-uniform lateral dimension. The core 110 has rounded edges that taper inward at ends 112 and narrow in a center 114. FIG. 9 also provides an example of a non-rectilinear core, which may nonetheless be disposed within a beam-shaped resonant structure with non-rounded edges. The tapering and narrowing may be reversed from the example shown. A variety of other shapes may be used, including ellipsoids and other rounded shapes. FIG. 10 shows an example core 116 having a non-uniform thickness. The core 116 includes a thinner central portion 118 disposed between thicker end portions 120, although the arrangement may also be reversed in alternative embodiments. The varying thickness of FIG. 10 may be combined to any desired extent with one or more of the embodiments with non-uniform lateral dimensions.

Notwithstanding the foregoing examples, the composite structures of the disclosed devices need not be configured for vertical mode vibration modes or flexural vibration modes, and need not be fabricated via surface micromachining techniques and materials. For instance, the disclosed devices may be configured for lateral flexural mode vibration or bulk acoustic mode vibration. In these and other embodiments, the composite structures may include single crystal silicon within which the internal dielectric region is disposed. The disclosed devices may thus be fabricated via SOI-based micromachining processes. The disclosed devices may also be fabricated via bulk micromachining and other processes.

One example of a lateral flexural mode resonator device configured with a temperature compensating internal core is shown in FIGS. 11-13. A resonator device 130 is configured for lateral flexural mode vibration. In this example, the resonator device 130 has a ring- or cylinder-shaped resonant structure 132 that vibrates in a wine-glass mode. To that end, the resonator device 130 may include one or more electrodes adjacent the resonant structure 132. The electrode(s) may, for instance, be laterally spaced from the resonant structure 132 by a gap 134. The ring-shaped resonant structure 132 may be supported by a number of support arms 136 that couple the structure 132 to a surrounding body 138, from which the resonant structure 132 and the support arms 136 may be formed, as described below. The resonant structure 132 and the support arms 136 may accordingly be formed from single crystal silicon. The surrounding body 138 may be made of single crystal silicon. Each support arm 136 may be configured as a vertically elongated rib that, for instance, may extend the thickness of the resonant structure 132. Each support arm 136 may extend from the body 138 to contact the structure 132 at a respective nodal point. The body 138 may thus be configured as an anchor for the resonant structure 132. One or more portions of the body 138 may be used as, or support, corresponding electrode(s). The body 138, in turn, is supported by a substrate (see FIGS. 14A-14G) in, for instance, an SOI arrangement.

As shown in FIG. 12 and best shown in the detailed view of FIG. 13, the resonant structure 132 includes one or more internal dielectric regions 140. In this example, each dielectric region 140 is configured as a vertically elongate trench, the cross-section of which is shown in FIG. 13. The dielectric region(s) 140 may laterally extend around the ring-shaped resonant structure 132. In this example, the internal core of the resonant structure 132 includes a pair of the dielectric regions 140, which are spaced from one another in a concentric arrangement. Each dielectric region 140 may be configured as a trench filled with silicon dioxide and/or other materials having a positive temperature coefficient of Young's modulus. In this way, the temperature instability arising from the negative temperature coefficient presented by the single crystal silicon may be cancelled or reduced.

The resonator device 130 further includes an external cap 142 disposed on a top surface of the resonant structure 132 to cover and thereby enclose the internal dielectric regions 140. The cap 142 may be shaped as a ring-shaped strip. The cap 142 may include a polysilicon layer deposited in the SOI-based process described below. The cap 142 may alternatively be any other device layer deposited in the device area to complete the enclosure of the dielectric regions.

In an alternative embodiment, the resonant structure has a solid ring- or cylinder-shaped configuration, rather than the hollow ring resonant structure shown in FIGS. 11-13. The vibration may remain configured in the wine-glass mode arrangement, but the resonant mode is a bulk acoustic mode (e.g., expansion mode) rather than a flexural mode. The shape of the resonant structure may vary from the solid cylinder configuration. Other shapes suitable for bulk acoustic mode vibration include, for instance, solid disks or pucks.

In another SOI embodiment, the resonant structure includes a patterned portion of the single crystal silicon layer, which forms a first device layer of the device. An oxide layer, which may be thermally grown, forms a dielectric structure on the first device layer. A polysilicon layer may then be deposited across the device area to cover the dielectric structure. One difference between this embodiment and the above-described embodiments is that the dielectric structure may not be considered an internal core, insofar as the dielectric structure itself encloses the single crystal silicon. The internal and other characteristics of the dielectric structure of the disclosed devices may thus vary from the examples above.

Figure 14A:
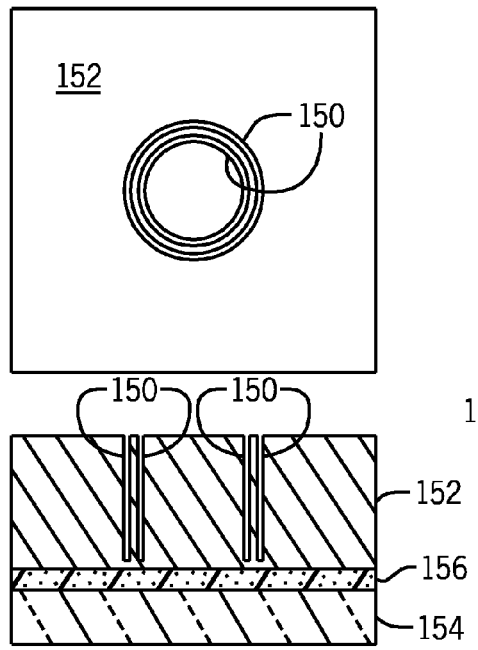
FIGS. 14A-14G are plan and cross-sectional, schematic views of the exemplary lateral flexural mode resonator device of FIGS. 11-13 during an SOI-based micromachining process of fabricating the MEMS resonator device in accordance with one embodiment.
Figure 14B:
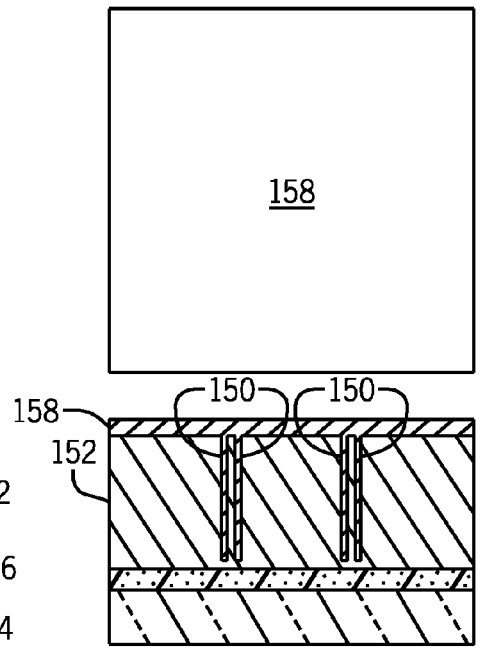
Figure 14C:
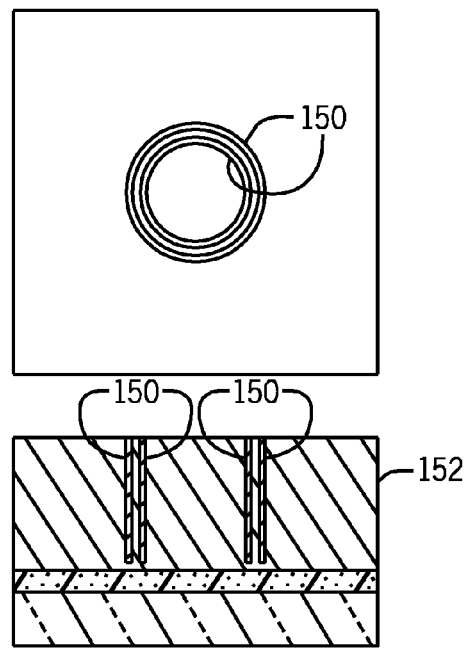

FIGS. 14A-14G depict an SOI-based micromachining fabrication process for fabricating the lateral flexural mode resonator device 130 described above. As shown in FIG. 14A, the process may begin with formation of one or more trenches 150 in a single crystal silicon layer 152 supported by a substrate 154 via an insulator layer 156 in an SOI arrangement. The trenches 150 may be formed via a reactive ion etch (RIE) in a device area portion of the single crystal silicon layer 152 that later forms the resonant structure of the device. As shown in FIG. 14B, the trenches 150 are then filled by a dielectric layer 158, such as silicon dioxide. The dielectric layer may be deposited and/or thermally grown. As a result, the dielectric layer 158 is formed (e.g., grown) across the device area on the exposed single crystal silicon layer 152. A planarization act may then be implemented to remove the dielectric layer 158 from the surface of the silicon layer 152, as shown in FIG. 14C, leaving only the dielectric structure in the device area supported by the silicon layer 152 within the trenches 150.

Figure 14D:
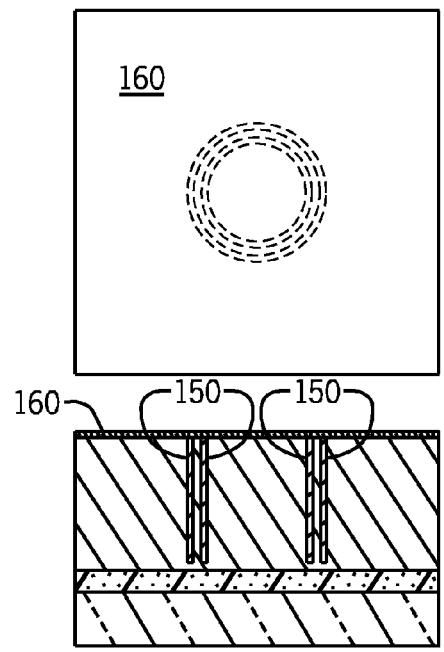
Figure 14E:
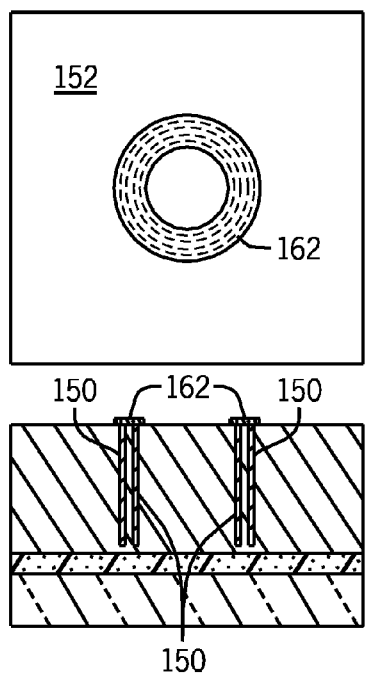

FIGS. 14D and 14E depict the deposition and patterning of a further device layer 160 in the device area, respectively. Once patterned, the device layer 160 may form a ring-shaped cap 162 (FIG. 14E) that covers the oxide-filled trenches 150, as described above. In one example, the device layer 160 includes polysilicon.

Figure 14F:
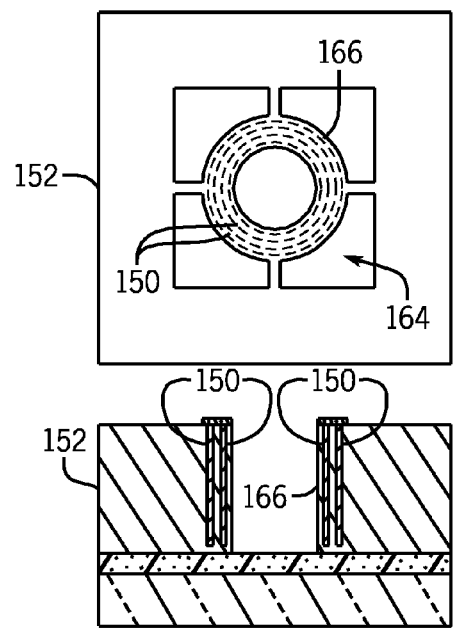
Figure 14G:
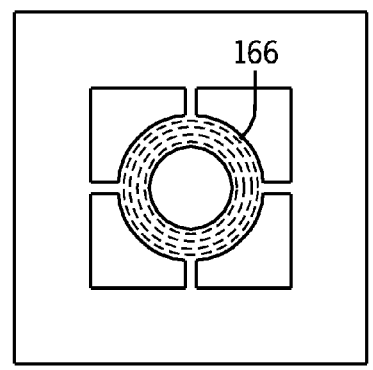
Figure 14G:
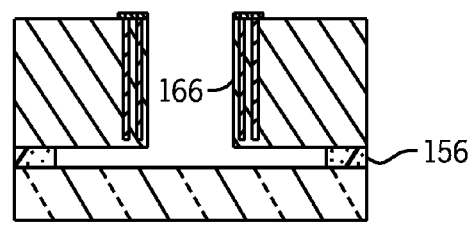

The patterning of the device layer 160 leaves portions of the silicon layer 152 for further patterning to define a gap 164 between a ring- or cylinder-shaped resonant structure 166 and the remainder of the silicon layer 152, as shown in FIG. 14F. The resonant structure 166 includes the dielectric-filled trenches 150 covered and enclosed by the patterned device layers (e.g., the silicon and polysilicon layers) 152, 162. Lastly, the resonant structure 166 is released as shown in FIG. 14G by removing a portion of the insulator layer 156 in the device area.

In an alternative fabrication process, the dielectric structure is grown on the single crystal silicon rather than deposited in, for instance, trenches. In this case, the exposed single crystal silicon is exposed for oxidation after patterning directed toward forming the resonant structure. As a result, the first device layer for the resonant structure is covered by a dielectric structure configured as a layer of silicon dioxide. A polysilicon layer may then be deposited as a second device layer to cover the oxide layer. Fabrication of the composite structure may then be complete.

Described above are fabrication processes that form a silicon dioxide, dielectric, or other temperature compensating core inside a resonant structure of a surface or SOI-based micro-machined resonator. In some embodiments, the dielectric core may be patterned in a manner that deviates from a contour or shape of the overall composite resonant structure. As a result, the temperature dependence of the resonant frequency (TCf) may be controlled by the thickness or other characteristic(s) of the core, including alternatively or additionally the location of the core.

While the temperature coefficient (TCf) of −20 ppm/° C. for polysilicon is mainly due to the negative temperature coefficient of its Young's modulus, silicon dioxide shows a positive TCf, as silicon dioxide has a positive temperature coefficient of its Young's modulus. Therefore, combining silicon dioxide and polysilicon may null the overall TCf of the combined resonator. For example, silicon-on-insulator (SOI) based resonators have achieved 100 ppm level of compensation from −40 to 85° C. by oxidizing the surface of the resonator. Please see Melamud et al., "Composite Flexural-mode Resonator With Controllable Turnover Temperature," 20th IEEE International Workshop on Micro Electro Mechanical Systems (MEMS'07), pp. 199-202 (2007), the entire disclosure of which is hereby incorporated by reference. However, in contrast the devices described in Malamud, the disclosed devices do not suffer from the charging effects on the surface of the oxidized SOI resonator. Because the silicon dioxide of the disclosed devices is trapped or embedded (or otherwise covered or enclosed) inside the composite resonant structure, the disclosed resonator devices do not exhibit charging problems.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

The foregoing description is given for clearness of understanding only, and no unnecessary limitations should be understood therefrom, as modifications within the scope of the invention may be apparent to those having ordinary skill in the art.

What is claimed is:

1. A device comprising:
a substrate;
an electrode supported by the substrate;
an anchor supported by the substrate; and
a composite structure supported by the anchor, disposed adjacent the electrode, and configured for resonant vibration;
wherein the composite structure comprises a pair of external conductive layers, a central conductive layer, and a pair of internal dielectric layers arranged in a stacked configuration in which:
each internal dielectric layer is disposed inward of, and in contact with, a respective one of the external conductive layers;
the pair of internal dielectric layers are spaced apart from one another in a direction of the resonant vibration by the central conductive layer;
each internal dielectric layer of the pair of internal dielectric layers is in contact with central conductive layer; and
each internal dielectric layer is offset from a center of the composite structure in the direction of the resonant vibration.

2. The device of claim 1, wherein each internal dielectric layer is enclosed by the pair of external conductive layers.

3. The device of claim 1, wherein the central conductive layer comprises polysilicon.

4. The device of claim 1, wherein each external conductive layer comprises polysilicon.

5. The device of claim 1, wherein each internal dielectric layer comprises silicon dioxide.

6. The device of claim 1, wherein the central conductive layer and each external conductive layer of the composite structure comprises polysilicon.

7. The device of claim 1, wherein the composite structure is beam-shaped.

8. The device of claim 1, wherein the electrode and the composite structure are spaced apart from one another by a gap, and wherein the resonant vibration is within the gap.

9. The device of claim 1, wherein the pair of external conductive layers form a polysilicon shell, and wherein each internal dielectric layer comprises a silicon dioxide layer disposed within the polysilicon shell.

10. The device of claim 9, wherein the central conductive layer comprises polysilicon.

11. The device of claim 1, wherein each internal dielectric layer is centered relative to lateral sides of the composite structure.

12. The device of claim 1, wherein each internal dielectric layer has a lateral shape that does not match a lateral shape of the composite structure.

13. The device of claim 1, wherein the composite structure is configured for flexural mode vibration.

14. The device of claim 1, wherein the composite structure is configured for wine-glass mode vibration.

15. The device of claim 1, wherein each external conductive layer of the composite structure comprises single crystal silicon within which each internal dielectric layer is disposed.

16. The micromechanical device of claim 1, wherein the pair of internal dielectric layers are symmetrically disposed with respect to a center of the composite structure along the direction of the resonant vibration.

17. A micromechanical device comprising:
a substrate;
an electrode supported by the substrate;
an anchor supported by the substrate; and
a composite structure supported by the anchor, disposed adjacent the electrode, and configured for resonant vibration;
wherein the composite structure comprises a pair of external polysilicon layers, a central polysilicon layer, and a pair of internal dielectric layers arranged in a stacked configuration in which:
the pair of internal dielectric layers are spaced apart from one another in a direction of the resonant vibration by the central polysilicon layer;
each internal dielectric layer is disposed inward of, and in contact with, a respective one of the external polysilicon layers;
each internal dielectric layer has a positive temperature coefficient of Young's modulus;
each internal dielectric layer is in contact with central polysilicon layer; and
each internal dielectric layer is offset from a center of the composite structure in the direction of the resonant vibration.

18. The micromechanical device of claim 17, wherein each internal dielectric layer comprises silicon dioxide.

19. The micromechanical device of claim 17, wherein each internal dielectric layer is embedded in polysilicon.

20. The micromechanical device of claim 17, wherein the composite structure is beam-shaped.

21. The micromechanical device of claim 17, wherein the electrode and the composite structure are spaced apart from one another by a gap, and wherein the resonant vibration is within the gap.

22. The micromechanical device of claim 17, wherein each internal dielectric layer has a lateral shape that does not match a lateral shape of the composite structure.

23. The micromechanical device of claim 17, wherein each internal dielectric layer is centered relative to lateral sides of the composite structure.

24. The micromechanical device of claim 17, wherein the pair of internal dielectric layers are symmetrically disposed with respect to a center of the composite structure along the direction of the resonant vibration.

25. The micromechanical device of claim 17, wherein each internal dielectric layer is enclosed by the pair of external polysilicon layers.

\* \* \* \* \*